(12) United States Patent
Ogura et al.

(10) Patent No.: US 7,157,772 B2
(45) Date of Patent: Jan. 2, 2007

(54) SEMICONDUCTOR DEVICE AND METHOD OF FABRICATING THE SAME

(75) Inventors: Hiroyoshi Ogura, Kyoto (JP); Hisao Ichijo, Soraku-gun (JP); Yoshinobu Sato, Takatsuki (JP); Teruhisa Ikuta, Ikoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/167,429

(22) Filed: Jun. 28, 2005

(65) Prior Publication Data

US 2006/0017105 A1 Jan. 26, 2006

(30) Foreign Application Priority Data

Jul. 22, 2004 (JP) .............................. 2004-214412

(51) Int. Cl.
*H01L 29/76* (2006.01)
*H01L 31/062* (2006.01)

(52) U.S. Cl. ...................... 257/343; 257/339; 257/492

(58) Field of Classification Search ................ 257/335, 257/339–341, 343, 345–347, 401, 492–493
See application file for complete search history.

(56) References Cited

U.S. PATENT DOCUMENTS

2003/0080388 A1* 5/2003 Disney et al. .............. 257/401

FOREIGN PATENT DOCUMENTS

| JP | 08-051223 | 2/1996 |
| JP | 09-289305 | 11/1997 |
| JP | 2001-230263 A | 8/2001 |

* cited by examiner

*Primary Examiner*—Thanhha S. Pham
(74) *Attorney, Agent, or Firm*—McDermott Will & Emery LLP (57) ABSTRACT

A gate electrode has an end extended over a part of a LOCOS oxide film, and a source electrode has an end extended further than the end of the gate electrode over a part of the LOCOS oxide film. An insulating film covering the gate electrode and the LOCOS oxide film is formed such that the thickness of the insulating film at an end-portion region, which is on an end portion of the gate electrode provided to extend over a part of the LOCOS oxide film, as viewed from a main surface of a supporting substrate, is smaller than the thickness of the insulating film below an end portion of the source electrode above the drain region and smaller than the thickness of the insulating film on an end portion of the gate electrode above a body region.

4 Claims, 7 Drawing Sheets

SEMICONDUCTOR DEVICE AND METHOD OF FABRICATING THE SAME

BACKGROUND OF THE INVENTION

1. Field of the Invention

The present invention relates to a semiconductor device and a method of fabricating the semiconductor device. More particularly, the present invention relates to a semiconductor device in which a high breakdown voltage lateral MOSFET (Metal Oxide Semiconductor Field Effect Transistor) is formed on an SOI (Silicon On Insulator) substrate, and a method of fabricating such a semiconductor device.

2. Description of the Background Art

In recent years, a semiconductor device in which an IC circuit and a high breakdown voltage element are combined has been used in various applications. In particular, in a semiconductor device for use in the driving circuit of a plasma display, a high breakdown voltage lateral MOSFET is employed. The structures of conventional high breakdown voltage lateral MOSFETs will be described in detail below with reference to drawings.

Figure 5:
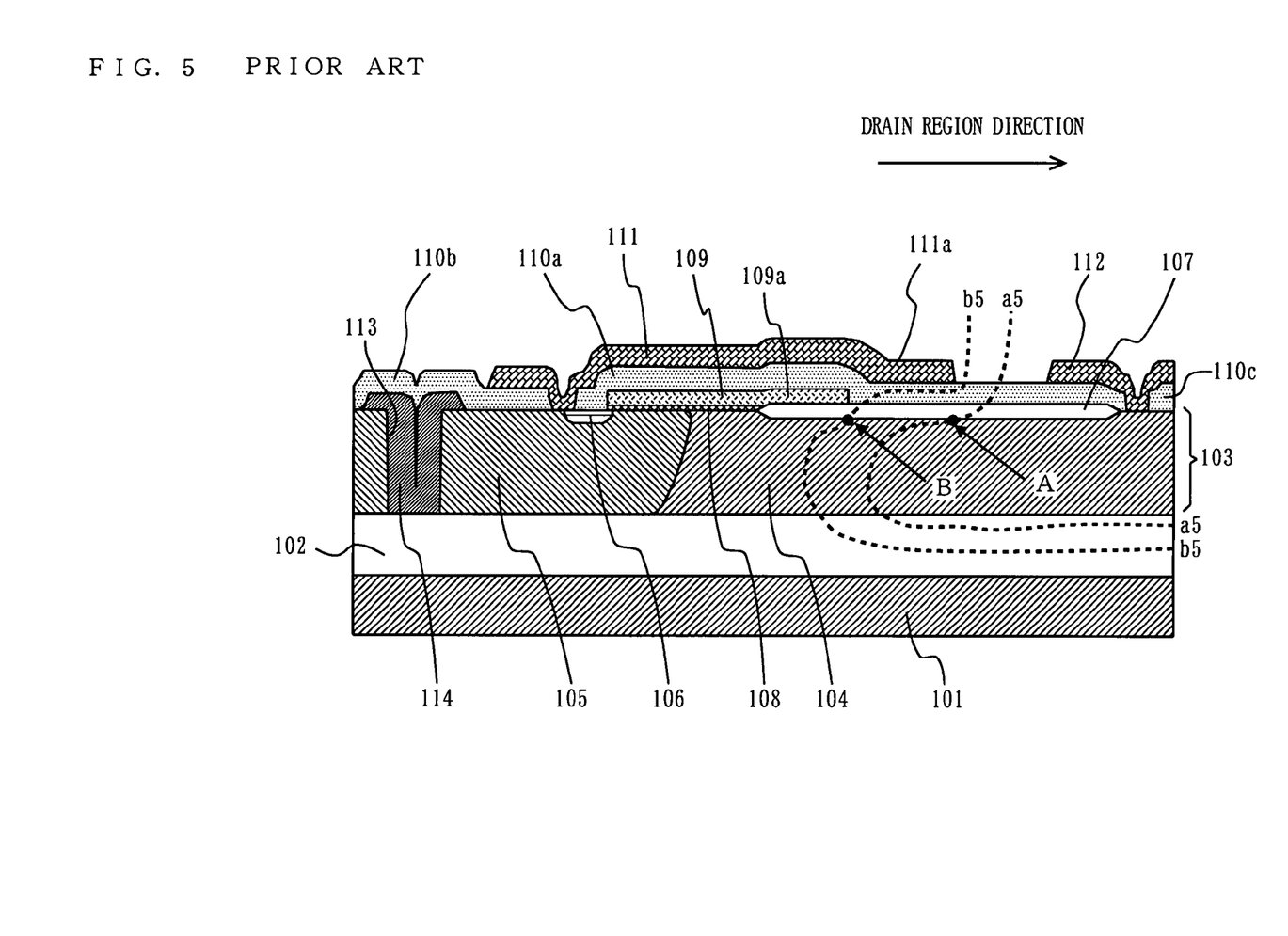
FIG. 5 is a cross-sectional view showing a configuration of a conventional high breakdown voltage lateral MOSFET.

FIG. 5 is a cross-sectional view showing a configuration of a conventional high breakdown voltage lateral MOSFET formed on an SOI substrate. In FIG. 5, a supporting substrate 101 serves as a base for forming the lateral MOSFET, and has a buried oxide film 102 formed thereon. An SOI layer 103 is formed on the buried oxide film 102. Although the supporting substrate 101 and the SOI layer 103 are originally individual silicon single crystal substrates, they are bonded together with the buried oxide film 102 placed therebetween and thereby compose a single substrate. A substrate having such a configuration is hereinafter referred to as an "SOI substrate".

A drain region 104 is formed by doping a relatively low concentration of an N-type impurity into the SOI layer 103. A body region 105 is formed by doping a P-type impurity into the SOI layer 103. A source region 106 is formed by doping a high concentration of an N-type impurity into the body region 105. A LOCOS (Local Oxidation of Silicon) oxide film 107 is an element isolating film formed on a main surface of the SOI layer 103 and is an oxide film formed by a thermal oxidation process. A gate oxide film 108 is an insulating film formed over both the drain region 104 and the body region 105 and between the source region 106 and the LOCOS oxide film 107, so as to contact with the LOCOS oxide film 107.

A gate electrode 109 is a polysilicon electrode formed on the gate oxide film 108. Interlayer insulating films 110a, 110b, and 110c are formed on a main surface of the SOI substrate so as to cover the gate electrode 109, the LOCOS oxide film 107, and the like. A source electrode 111 is a metallic electrode formed over both the interlayer insulating films 110a and 110b. A part of the source electrode 111 is connected to the source region 106. A drain electrode 112 is a metallic electrode formed over both the interlayer insulating films 110a and 110c. A part of the drain electrode 112 is connected to the drain region 104. An isolation trench 113 is provided to electrically isolate adjacent elements. A filling insulating film 114 is an insulating film to fill the isolation trench 113.

In the high breakdown voltage lateral MOSFET configured in the above-described manner, if a high voltage is applied to the drain electrode 112 while the source electrode 111 and the gate electrode 109 are grounded, the electric field at a PN junction between the body region 105 and the drain region 104 increases, and as a result, a depletion layer spreads within the drain region 104 having a lower impurity concentration than the body region 105. Here, due to the influence of a fixed charge present in the drain region 104, the influence of an interface charge present at an interface between the drain region 104 and the LOCOS oxide film 107, or the like, the spread of the depletion layer on a main surface of the drain region 104 is suppressed, and therefore an electric field is concentrated at a PN junction portion, whereby the PN-junction breakdown voltage capability becomes susceptible to degradation.

In view of this, in order to improve the PN-junction breakdown voltage capability, the gate electrode 109 and the source electrode 111 employ a field plate structure as follows. The gate electrode 109 has a field plate structure in which an end of the gate electrode 109 above the drain region 104 is extended over a part of the LOCOS oxide film 107 to provide a field plate portion 109a; the gate electrode 109 and the field plate portion 109a are integrally formed. The source electrode 111 has a field plate structure in which an end of the source electrode 111 above the drain region 104 is extended over a part of the LOCOS oxide film 107 to provide a field plate portion 111a; the source electrode 111 and the field plate portion 111a are integrally formed.

By thus providing a field plate structure to the gate electrode 109 and the source electrode 111, the spread of a depletion layer on the main surface of the drain region 104 can be promoted and thus the electric field concentration at the PN junction portion can be reduced. Accordingly, the PN-junction breakdown voltage capability between the body region 105 and the drain region 104 can be improved. Such an effect is hereinafter referred to as the "field plate effect".

By providing the field plate portion 111a of the source electrode 111 so as to extend further than the field plate portion 109a of the gate electrode 109 in a drain region direction (shown by an arrow in FIG. 5), the field plate effect can be further enhanced compared to the case where a field plate structure is provided only to the gate electrode 109; or the case where an end of the field plate portion 111a and an end of the field plate portion 109a above the drain region 104, as viewed from the main surface of the supporting substrate 101, are both at the same position; or the case where the field plate portion 109a is provided so as to extend further than the field plate portion 111a in the drain region direction.

In FIG. 5, a broken line a5 indicates an equipotential line in the drain region 104 with point A present below an end of the field plate portion 111a of the source electrode 111, as the center; and a broken line b5 indicates an equipotential line in the drain region 104 with point B present below an end of the field plate portion 109a of the gate electrode 109, as the center. By providing the field plate portion 111a of the source electrode 111 so as to extend further than the field plate portion 109a of the gate electrode 109 in the drain region direction, the combined thickness of the insulating films present below the end of the field plate portion 111a, i.e., the combined thickness of the LOCOS oxide film 107 and the interlayer insulating film 110a, becomes larger than the thickness of the insulating film present below the end of the field plate portion 109a of the gate electrode 109, i.e., the thickness of the LOCOS oxide film 107. Therefore, the equipotential line (broken line b5) is drawn toward the field plate portion 111a, where by a curvature reduction is prevented. By this, the increase in the electric field at the point B below the end of the field plate portion 109a of the gate electrode 109 is suppressed, making it possible to further improve the field plate effect.

Note, however, that if a high voltage is further applied to the drain electrode 112, the electric field at the point A below the end of the field plate portion 111a of the source electrode 111 rapidly increases. In such a case, as shown in FIG. 6, by increasing the combined thickness of the insulating films present below the end of the field plate portion 111a, in particular, a thickness d1 of the interlayer insulating film 110a, the increase in the electric field at the point A can be suppressed (see, for example, Japanese Laid-Open Patent Publication No. 9-289305).

The increase in the electric field at the point A can be suppressed for the following reasons. By increasing the thickness d1 of the interlayer insulating film 110a, the distance from a depletion layer boundary in the drain region 104 to the source electrode 111 is increased and accordingly the curvature of the equipotential line (broken line a6) in the drain region with the point A as the center is increased, whereby the effect of reducing electric field concentration can be obtained. Another reason is that since an electric field is loaded on the interlayer insulating film 110a, the LOCOS oxide film 107, and the drain region 104, by increasing the combined thickness of the interlayer insulating film 110a and the LOCOS oxide film 107 which are formed from an oxide film having a lower relative permittivity than a silicon, for example, and which are present below the end of the field plate 111a of the source electrode 111, the load of electric field on the drain region 104 can be reduced.

Figure 6:
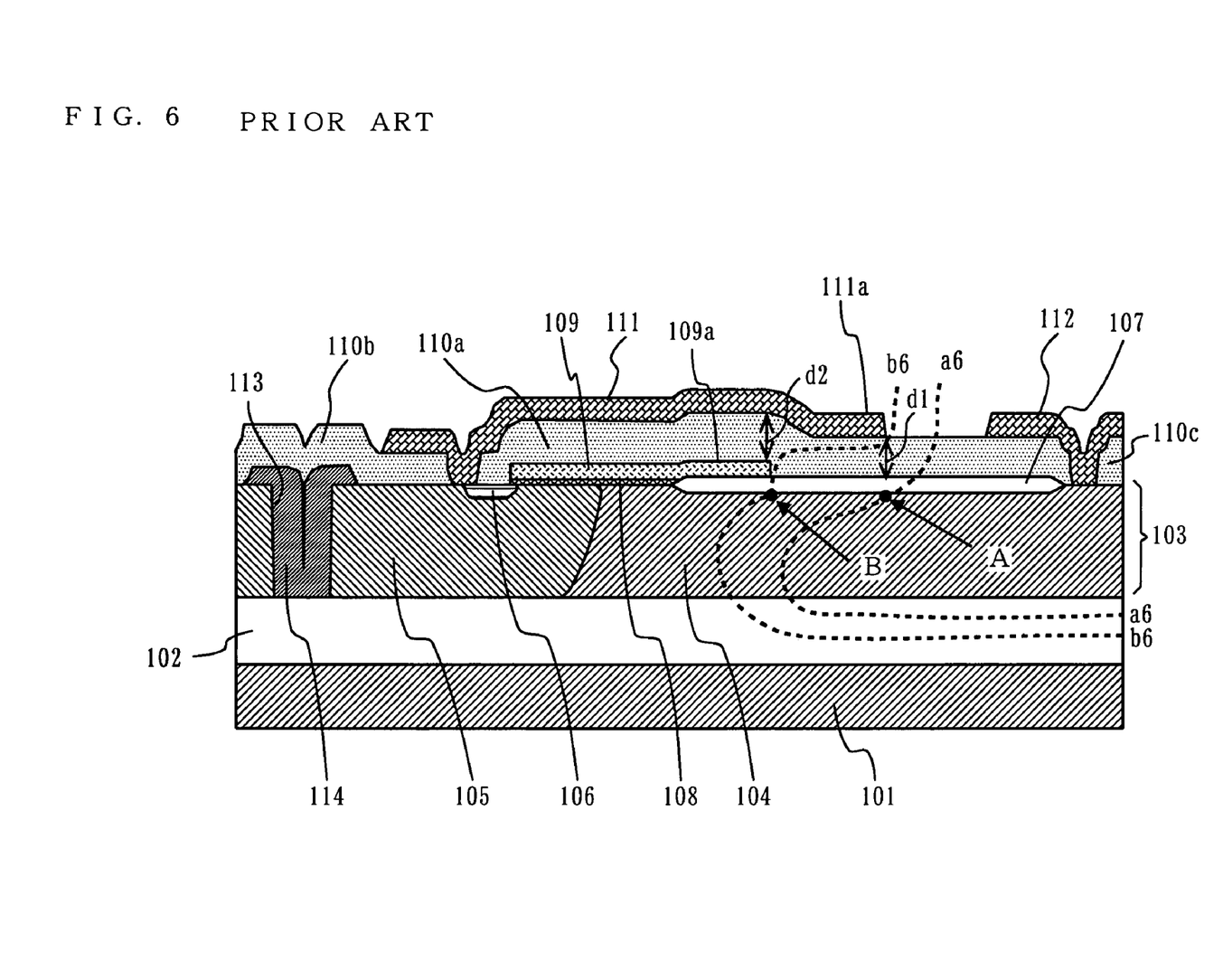
FIG. 6 is a cross-sectional view showing a configuration of another conventional high breakdown voltage lateral MOSFET.

In FIG. 6, since an equipotential line (broken line b6) is drawn toward a field plate portion 111a of a source electrode 111 due to the field plate effect of the source electrode 111, the effect of preventing a reduction in the curvature of the equipotential line (broken line b6) in a drain region with point B as the center, can be obtained, which cannot be obtained with the case where a field plate structure is provided only to a gate electrode 109; accordingly the increase in the electric field present below an end portion of the gate electrode 109 as shown by the point B can be suppressed. Further, by increasing the thickness d1 of the interlayer insulating film 110a, the capacitance between the gate electrode 109 and the source electrode 111 is reduced, and therefore the effect of improving switching speed can also be obtained.

Japanese Laid-Open Patent Publication No. 9-289305 proposes a technique for further improving the PN-junction breakdown voltage capability between a body region 105 and a drain region 104, which is realized by the configuration of a semiconductor device shown in FIG. 6, in addition to which an insulation plate (not shown) is partially provided below an end of a field plate portion 111a of a source electrode 111.

However, as shown in FIG. 6, if the thickness d1 of the interlayer insulating film 110a present below the end of the field plate portion 111a is increased, a thickness d2 of the interlayer insulating film 110a formed above the end of the field plate portion 109a of the gate electrode 109 is also naturally increased. Consequently, the field plate effect of the source electrode 111 is reduced, and the equipotential line shown by the broken line b6 starts to depend greatly on the field plate effect of the gate electrode 109. In addition, since the thickness of an insulating film present below the end of the field plate portion 109a of the gate electrode 109, i.e., the thickness of an LOCOS oxide film 107, is small, the electric field at the point B rapidly increases.

Figure 7:
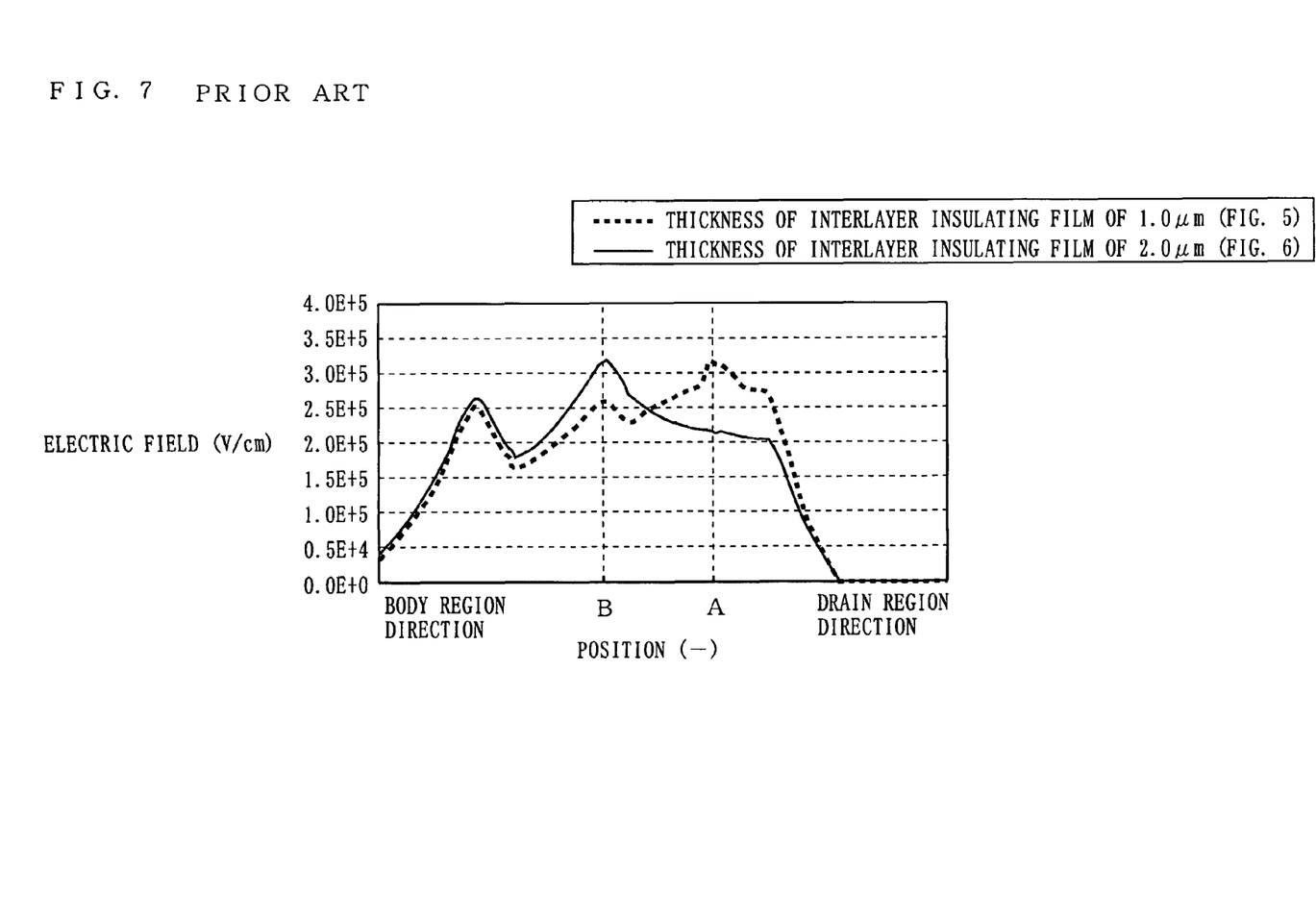
FIG. 7 is a graph showing analysis results for the electric field distributions of the high breakdown voltage lateral MOSFETs shown in FIGS. 5 and 6.

FIG. 7 shows results obtained by analyzing the electric field distributions of the high breakdown voltage lateral MOSFETs shown in FIGS. 5 and 6 with a two-dimensional simulation. In FIG. 7, the vertical axis of the graph represents electric field (V/cm), and the horizontal axis represents the measured position of the electric field. A and B on the horizontal axis represent the points A and B of FIGS. 5 and 6, respectively. In FIG. 7, a broken line shows the analysis result for the case where the high breakdown voltage lateral MOSFET shown in FIG. 5 has an interlayer insulating film 110a with a thickness of 1.0 µm, and a solid line shows the analysis result for the case where the high breakdown voltage lateral MOSFET shown in FIG. 6 has an interlayer insulating film 110a with a thickness of 2.0 µm.

It is clear from the analysis results shown in FIG. 7 that by increasing the thickness of the interlayer insulating film 110a, although the increase in the electric field at the point A below the end of the field plate portion 111a of the source electrode 111 can be suppressed, the electric field at the point B below the end of the field plate portion 109a of the gate electrode 109 increases. From this fact, it can be seen that when the thickness of the interlayer insulating film 110a is below a certain thickness, by increasing the thickness of the interlayer insulating film 110a, the PN-junction breakdown voltage capability can be improved; however, when the thickness of the interlayer insulating film 110a is above the certain thickness, the PN-junction breakdown voltage capability is likely to degrade. Namely, it is not possible to further improve the PN-junction breakdown voltage capability only by adjusting the thickness of the interlayer insulating film 110a.

To form an insulation plate below an end of a field plate 111a of a source electrode 111, as described in Japanese Laid-Open Patent Publication No. 9-289305, an additional process of depositing an insulating film is required, which increases processing costs. Further, even if such an insulation plate is provided, since the thickness of an insulating film between a gate electrode 109 and a source electrode 111 does not change, it is not possible to obtain the effect of improving switching speed resulting from a reduction in the capacitance between the gate electrode 109 and the source electrode 111.

SUMMARY OF THE INVENTION

Therefore, an object of the present invention is to provide a semiconductor device capable of improving the PN-junction breakdown voltage capability and increasing switching speed, and a method of fabricating such a semiconductor device.

The present invention has the following features to attain the object mentioned above. The present invention is directed to a semiconductor device comprising: an SOI layer formed on a supporting substrate with a buried oxide film placed therebetween; a body region of a first conductive type selectively formed in a main surface of the SOI layer; a source region of a second conductive type formed in a main surface of the body region; a drain region of the second conductive type formed in the main surface of the SOI layer so as to be adjacent to the body region; an element isolating film formed on the drain region; a gate oxide film formed on a region of the main surface of the SOI layer between the source region and the element isolating film; a drain electrode connected to the drain region; a gate electrode formed on the gate oxide film so as to have an end extended over a part of the element isolating film; an insulating film covering the gate electrode and the element isolating film; and a source electrode formed on the insulating film so as to be connected to the source region and to have an end extended further than the end of the gate electrode in the drain region direction. In the semiconductor device, the insulating film is formed such that a thickness of the insulating film at an end-portion region, which is on an end portion of the gate electrode provided to extend over a part of the element isolating film, as viewed from a main surface of the supporting substrate, is smaller than a thickness of the insulating film below an end portion of the source electrode above the drain region and smaller than a thickness of the insulating film on an end portion of the gate electrode above the bode region.

As described above, by making the thickness of the insulating film formed on the end-portion region of the gate electrode smaller than the thickness of the insulating film at other locations, the breakdown voltage present below an end portion of the gate electrode extended over a part of the element isolating film can be increased, while also increasing the breakdown voltage present below an end portion of the source electrode extended over a part of the element isolating film. In addition, the capacitance between the gate electrode and the source electrode is reduced, and accordingly, switching speed can be increased.

In order to form an insulating film having the above-described thickness, the insulating film may be composed of a first insulating film formed on the gate electrode and the element isolating film; and a second insulating film covering the first insulating films. It is preferable that an end portion of a first insulating film formed on the gate electrode, which is present above the drain region, be located so as not to overlap with the end portion of the gate electrode above the drain region, as viewed from the main surface of the supporting substrate. By this, the thickness of the insulating film which influences the PN-junction breakdown voltage capability and switching speed can be increased, while reducing the thickness of only a portion of the insulating film on the end-portion region of the gate electrode.

If a spacing distance between the end portion of the gate electrode above the drain region and an end portion of the first insulating film formed on the element isolating film, which faces the end portion of the gate electrode, as viewed from the main surface of the supporting substrate, is at least twice as large as a thickness of the second insulating film, the PN-junction breakdown voltage capability can be further enhanced and switching speed can be increased. Alternatively, the SOI layer may further include an isolation trench which reaches the buried oxide film, and it is preferable that the isolation trench have the first insulating film buried therein.

The present invention is also directed to a method of fabricating a semiconductor device which comprises the following steps. Specifically, first, a body region of a first conductive type is selectively formed in a main surface of an SOI layer, the SOI layer being formed on a supporting substrate with a buried oxide film placed therebetween. A source region of a second conductive type is formed in a main surface of the body region. A drain region of the second conductive type is formed in the main surface of the SOI layer so as to be adjacent to the body region. An element isolating film is formed on the drain region. A gate oxide film is formed on a region of the main surface of the SOI layer between the source region and the element isolating film. A drain electrode is formed so as to be connected to the drain region. A gate electrode is formed on the gate oxide film so as to have an end extended over a part of the element isolating film. An insulating film is formed so as to cover the gate electrode and the element isolating film. On the insulating film, a source electrode is formed so as to be connected to the source region and to have an end extended further than the end of the gate electrode in a drain region direction. In the forming of an insulating film, the insulating films is formed such that a thickness of the insulating film at an end-portion region, which is on an end portion of the gate electrode provided to extend over a part of the element isolating film, as viewed from a main surface of the supporting substrate, is smaller than a thickness of the insulating film below an end portion of the source electrode above the drain region and smaller than a thickness of the insulating film on an end portion of the gate electrode above the body region.

Specifically, in the forming of an insulating film, first, a first insulating film is formed so as to cover the gate electrode and the element isolating film. Then, a portion of the first insulating film which covers the end-portion region is selectively etched such that an end portion of the first insulating film formed on the gate electrode, which is present above the drain region, is located so as not to overlap with the end portion of the gate electrode above the drain region, as viewed from the main surface of the supporting substrate. Subsequently, a second insulating film is formed so as to cover the first insulating film and the element isolating film.

It is preferable that, in the etching, in addition to the end-portion region, at least a part of the first insulating film being adjacent to the end-portion region and being formed on the element isolating film be etched such that the end portion of the gate electrode above the drain region and an end portion of the first insulating film formed on the element isolating film, which faces the end portion of the gate electrode, as viewed from the main surface of the supporting substrate, are spaced apart from each other by a distance larger than at least twice a thickness of the second insulating film.

Alternatively, prior to the forming of an insulating film, an isolation trench may be formed so as to reach the buried oxide film from the main surface of the SOI layer. In the forming of a first insulating film, the first insulating film maybe formed so as to fill the isolation trench and to cover the gate electrode and the element isolating film. As described above, by using the first insulating film as an insulating film to fill an isolation trench, it is possible to eliminate the necessity of increasing the number of processes, as in the aforementioned conventional cases, and thus it is possible to prevent an increase in processing costs resulting from the addition of a process.

According to the present invention, as described above, without the need to increase the thickness of the insulating film present on the end-portion region of the gate electrode, the thickness of the insulating film below an end of the field plate portion of the source electrode and the thickness of the insulating film above an end portion of the gate electrode above the body region can be increased, and therefore the PN-junction breakdown voltage capability between the body region and the drain region can be improved. In addition, since the thickness of the insulating film between the gate electrode and the source electrode except for the end-portion region can be increased, it is also possible to reduce the capacitance between the gate electrode and the source electrode and increase switching speed.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
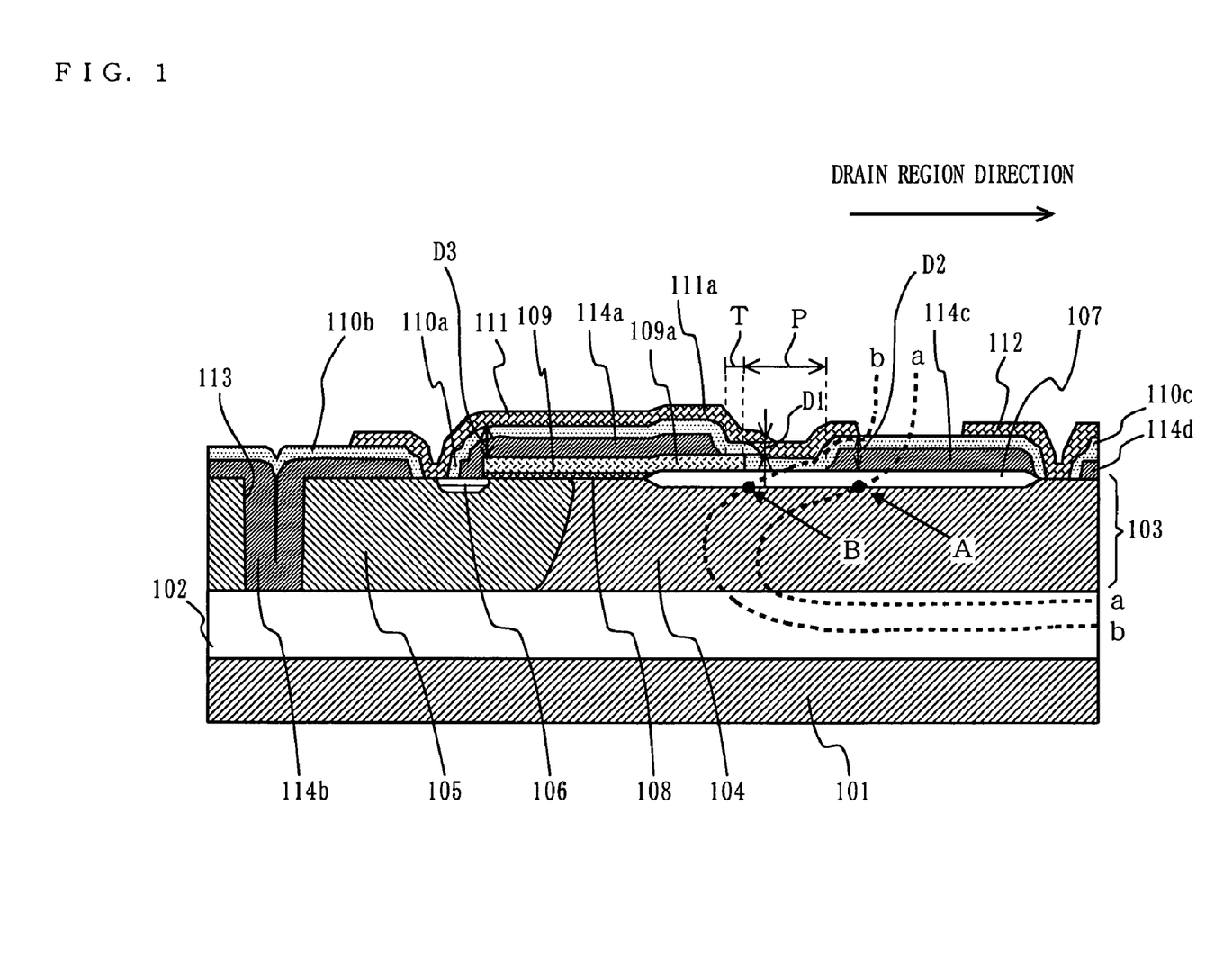
FIG. 1 is a cross-sectional view showing a configuration of a high breakdown voltage lateral MOSFET according to an embodiment of the present invention.

A semiconductor device and a method of fabricating the semiconductor device, according to an embodiment of the present invention will be described in detail below using, as an example, an N-channel high breakdown voltage lateral MOSFET. FIG. 1 is a cross-sectional view showing a configuration of a semiconductor device according to an embodiment of the present invention. The semiconductor device shown in FIG. 1 has a supporting substrate 101, a buried oxide film 102, an SOI layer 103, a drain region 104, a body region 105, a source region 106, a LOCOS oxide film 107, a gate oxide film 108, a gate electrode 109, interlayer insulating films 110a, 110b, and 110c, a source electrode 111, a drain electrode 112, an isolation trench 113, and filling insulating films 114a, 114b, 114c, and 114d.

The semiconductor device shown in FIG. 1 is formed on an SOI substrate. As described above, the SOI substrate is composed by bonding together the supporting substrate 101 and the SOI layer 103, which are originally individual silicon single crystal substrates, with the buried oxide film 102 having a thickness of the order of 1 to 2 unplaced therebetween. In such an SOI substrate, the SOI layer 103 is subjected to a planarization process such that the SOI layer 103 is polished from its main surface to a depth of the order of 3 to 5 µm.

The SOI layer 103 has the drain region 104, the body region 105, and the source region 106 formed therein. The drain region 104 is an impurity region formed of a relatively low concentration of an N-type impurity, and the body region 105 is an impurity region formed of a P-type impurity. The drain region 104 and the body region 105 are formed so as to be adjacent to each other. The source region 106 is an impurity region formed by doping a high concentration of an N-type impurity into the body region 105.

The LOCOS oxide film 107, serving as an element isolating film, is an oxide film provided to isolate adjacent elements, and is formed on the main surface of the SOI layer 103 by a thermal oxidation process. The thickness of the LOCOS oxide film 107 is 200 to 600 nm. The gate oxide film 108 is an insulating film formed in a region where a channel is to be formed, and is formed by a thermal oxidation process so as to contact with the LOCOS oxide film 107. The isolation trench 113 is provided to electrically isolate adjacent elements, and is formed in a part of the body region 105 so as to reach the buried oxide film 102 from the main surface of the SOI layer 103. The drain electrode 112 is a metallic electrode, and a part of the drain electrode 112 is connected to the drain region 104.

The gate electrode 109 is a polysilicon electrode formed over both the drain region 104 and the body region 105 with the gate oxide film 108 placed between the gate electrode 109 and the drain and body regions 104, 105. The source electrode 111 is a metallic electrode formed such that a part of the source electrode 111 is connected to the source region 106. In the present embodiment, in order to improve the PN-junction breakdown voltage capability, a field plate structure is provided to both the gate electrode 109 and the source electrode 111. Specifically, the gate electrode 109 has a field plate portion 109a formed by extending an end of the gate electrode 109 present above the drain region 104, over a part of the LOCOS oxide film 107; the gate electrode 109 and the field plate portion 109a are integrally formed. The source electrode 111 has a field plate portion 111a formed by extending an end of the source electrode 111 present above the drain region 104, over a part of the LOCOS oxide film 107; the source electrode 111 and the field plate portion 111a are integrally formed. In order to further enhance the PN-junction breakdown voltage capability, the field plate portion 111a of the source electrode 111 is provided so as to extend further than the field plate portion 109a of the gate electrode 109 in a drain region direction (shown by an arrow in FIG. 1).

Now, an insulating film which is a characteristic of the present embodiment, in particular, an insulating film formed between the gate electrode 109 and the source electrode 111 will be described in detail. For the insulating film formed between the gate electrode 109 and the source electrode 111, the present embodiment describes the case, as an example, where the insulating film is composed of a first insulating film and a second insulating film. The first insulating film is formed on the gate electrode 109 and the LOCOS oxide film 107; in the present embodiment, the filling insulating films 114a, 114b, 114c, and 114d to fill the isolation trench 113 serve as the first insulating films. Specifically, the filling insulating films 114a, 114b, 114c, and 114d are formed so as to fill the isolation trench 113 and to selectively cover a portion of each of the SOI layer 103, the gate electrode 109, and the LOCOS oxide film 107; for example, the filling insulating films 114a, 114b, 114c, and 114d may be formed from TEOS (Tetra Ethyl Ortho Silicate) films and to a thickness of the order of 300 nm to 1000 nm.

The second insulating film serves to cover the first insulating film. Here, the second insulating film is described using, as an example, the interlayer insulating films 110a, 110b, and 110c. The interlayer insulating films 110a, 110b, and 110c are formed to cover the filling insulating films 114a, 114b, 114c, and 114d and to selectively cover a portion of each of the SOI layer 103, the gate electrode 109, and the LOCOS oxide film 107. The thickness of the interlayer insulating films 110a, 110b, and 110c should be such that dielectric strength between the gate electrode 109 and the source electrode 111 is ensured; for example, the thickness is the order of 300 nm to 1000 nm.

The above mentioned first and second insulating films are formed such that a thickness D1 of a second insulating film at an end-portion region T, which is present on an end portion of the field plate portion 109a provided to extend over a part of the LOCOS oxide film 107, as viewed from the main surface of the supporting substrate 101, is smaller than a combined thickness D2 of first and second insulating films present below an end of the field plate portion 111a of the source electrode 111 and smaller than a combined thickness D3 of first and second insulating films present on an end portion of the gate electrode 109 above the body region.

As described above, on the end-portion region T of the field plate portion 109a only the interlayer insulating film 110a is provided as an insulating film, whereby the electric field present below the end of the field plate portion 109a, i.e., at the point B, can be reduced. In addition, by making the thickness D2 larger than the thickness D1 by providing, as insulating films, the filling insulating film 114c and the interlayer insulating film 110 a below the end of the field plate portion 111a, the electric field at the point A can be reduced. Such a configuration not only provides the field plate effect but also further improves the PN-junction breakdown voltage capability.

Further, by increasing the combined thickness D3 of the insulating films by providing, as insulting films, the filling insulating film 114a and the interlayer insulating film 110a on the end portion of the gate electrode 109 above the body region, the capacitance between the gate electrode 109 and the source electrode 111 can be reduced, and accordingly, switching speed can be increased.

In the semiconductor device according to the present embodiment, it is desirable that a spacing distance P between an end portion of the field plate portion 109a above the drain region 104 and an end portion of the filling insulating film 114c facing the end portion of the field plate portion 109a, as viewed from the main surface of the supporting substrate 101, be as large as possible; specifically, it is desirable that the spacing distance P be twice or more the thickness of the interlayer insulating film 110a. By providing such a spacing distance P, it is possible to form an interlayer insulating film 110a between the source electrode 111 and the filling insulating film 114c without increasing the thickness of the interlayer insulating film 110a, and the effect of reducing the electric field present below the end of the field plate portion 109a, i.e., at the point B, can be obtained, and accordingly, the PN-junction breakdown voltage capability can be further improved.

Figure 2A:
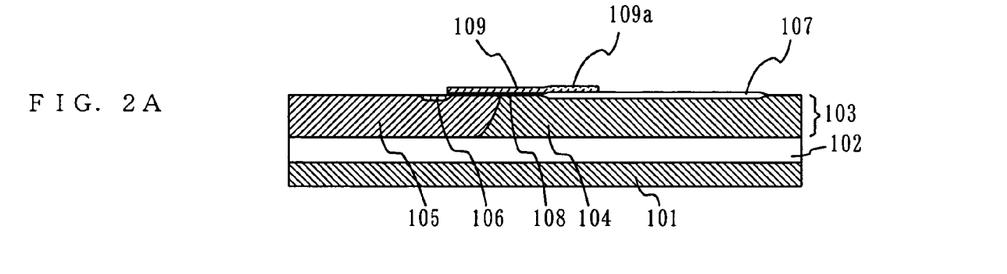
FIGS. 2A to 2D are diagrams showing the fabrication processes of the high breakdown voltage lateral MOSFET shown in FIG. 1.

A method of fabricating a lateral MOSFET having the above-described configuration will be described with reference to FIGS. 2A to 2D. FIGS. 2A to 2D are cross-sectional views of a semiconductor substrate and films formed on the semiconductor substrate in the process of fabricating the lateral MOSFET shown in FIG. 1. FIG. 2A shows a state in which a gate insulating film 108, a gate electrode 109, and a LOCOS oxide film 107 are formed on a main surface of an SOI substrate. The SOI substrate having such a state is obtained as follows. First, a P-type impurity such as boron is selectively doped into a main surface of an SOI layer 103 by an ion implantation process and then the SOI layer 103 is heated at a high temperature of the order of from 1000° C. to 1200° C. By doing this, the doped impurity is diffused and a body region 105 is formed in the SOI layer 103.

Next, phosphorus and arsenic, which are N-type impurities, are selectively doped into a main surface of the body region 105 by an ion implantation process and then the body region 105 is subjected to an annealing process at a high temperature of the order of 900° C. By doing this, a source region 106 which is a high-concentration N-type impurity region is formed in the body region 105. Then, by selectively doping phosphorus, which is an N-type impurity, into the main surface of the SOI layer 103 by an ion implantation process and then heating the SOI layer 103 at a high temperature of from 1000° C. to 1200° C. such that the doped impurity is diffused so as to be adjacent to the body region 105, a drain region 104 is formed in the SOI layer 103.

Subsequently, a LOCOS oxide film 107 is formed on a main surface of the drain region 104 by a thermal oxidation process. Then, a gate oxide film 108 is formed by a thermal oxidation process on a region which extends over both the drain region 104 and the body region 105 and serves as a channel region. A gate electrode 109 composed of polysilicon is formed on the gate oxide film 108. At this stage, a field plate portion 109a is simultaneously formed by extending an end of the gate electrode 109 over a part of the LOCOS oxide film 107.

Figure 2B:
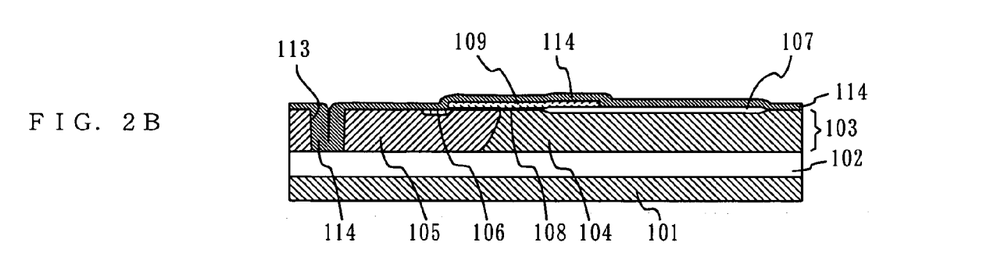

FIG. 2B shows a state in which the main surface of the SOI substrate is covered with a filling insulating film 114. The SOI substrate having such a state is obtained as follows. First, in order to isolate adjacent elements, an isolation trench 113 is formed by performing RIE (Reactive Ion Etching) on the SOI layer 103 at a peripheral portion of an element such that the SOI layer is etched from the main surface thereof to a surface of a buried oxide film 102. Then, a filling insulating film 114 formed from a TEOS film, for example, is formed by a CVD (Chemical Vapor Deposition) process so as to fill the isolation trench 113 and to cover the entire surface of the SOI substrate. The thickness of the filling insulating film 114 in the isolation trench 113 is on the order of 1000 nm, and the thickness in other locations is on the order of 300 nm.

Figure 2C:
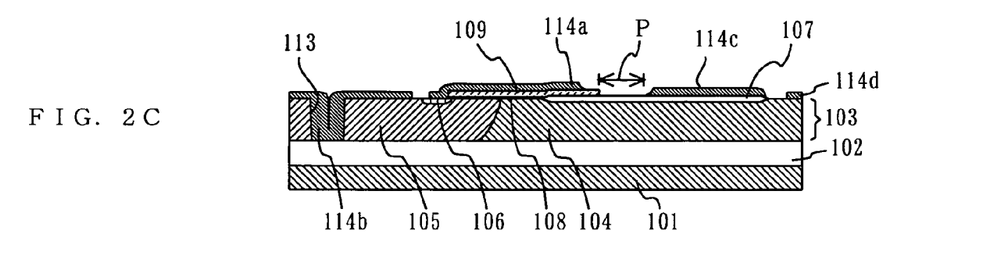

FIG. 2C is a state in which the filling insulating film 114 is formed in a desired pattern. The SOI substrate having such a state is obtained as follows. First, a resist film (not shown) is formed by applying a resist onto the filling insulating film 114. By performing exposure and development processes on the resist film, a resist pattern patterned in a desired shape is formed. Using the resist pattern as a mask, the filling insulating film 114 is etched by RIE or an etching process using a hydrogen fluoride solution, whereby filling insulating films 114a, 114b, 114c, and 114d in a desired pattern are formed. Note that the resist pattern is removed by ashing or the like.

Upon patterning the filling insulating film 114, it is desirable that a spacing distance P between an end portion of the field plate portion 109a above the drain region 104 and an end portion of the filing insulating film 114c facing the end portion of the field plate portion 109a be provided as large as possible; specifically, it is desirable that the spacing distance P be twice or more the thickness of an interlayer insulating film 110a, as will be described later, for the following reason. On a portion of the LOCOS oxide film 107 where the spacing distance P is provided, film materials are deposited from both the end portion of the field plate portion 109a and the end portion of the filling insulating film 114c facing the end portion of the field plate portion 109a, and thereby an interlayer insulating film 110a is formed. Thus, if the spacing distance P is too small, the film materials deposited from the gate electrode 109 and the filling insulating film 114c may come into contact with each other, and accordingly, an interlayer insulating film 110a having a large thickness may be formed on the LOCOS oxide film 107. This reduces the effect of reducing the electric field present below the end of the field plate portion 109a, i.e., at the point B, and thus it is desirable that the spacing distance P be provided as large as possible.

Figure 2D:
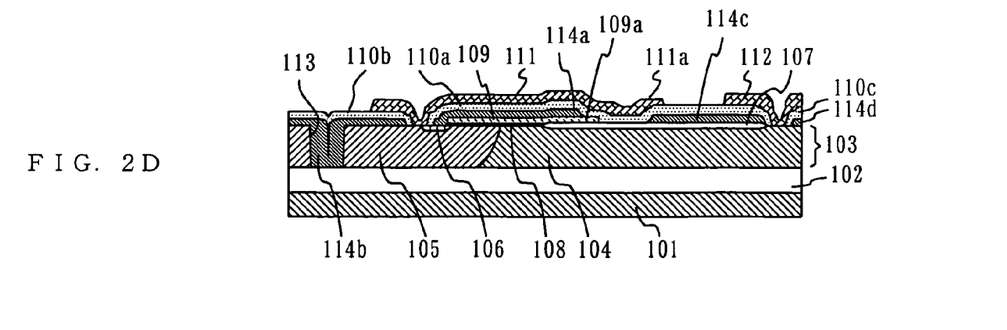

FIG. 2D is a state in which a lateral MOSFET according to the present embodiment is formed. A semiconductor device having such a state is obtained as follows. First, a BPSG (Boron Phosphorous Silicate Glass) film is deposited on the entire surface of the substrate by a CVD process. Then, the BPSG film is subjected to an annealing process at high temperatures, whereby interlayer insulating films 110a, 110b, and 110c are formed. Here, it is desirable that an end portion of each of the interlayer insulating films 110a, 110b, and 110c formed on the filling insulating films 114a, 114b, 114c, and 114d be tapered so as to ensure coverage.

Then, a source electrode 111 is formed on the interlayer insulating films 110a and 110b and a drain electrode 112 is formed on the interlayer insulating film 110c. The source electrode 111 is formed so as to be connected to a part of the source region 106 and to have a field plate portion 111a extended further than the field plate portion 109a over the LOCOS oxide film 107 in the drain region direction. The drain electrode 112 is formed so as to be connected to the drain region 104.

As described above, according to the method of fabricating a semiconductor device of the present embodiment, in order to adjust the thickness of an insulating film between a gate electrode 109 and a source electrode 111, a filling insulating film 114 to fill an isolation trench 113 is used as a first insulating film, which eliminates the necessity of additionally forming an insulating film by deposition, as in the conventional case described in Japanese Laid-Open Patent Publication No. 9-289305; accordingly, a reduction in fabrication cost is achieved. In addition, by a simple process in which the first insulating film is formed in a desired pattern by an etching process, the thickness of an insulating film between the gate electrode 109 and the source electrode 111 can be easily made to a desired thickness.

Figure 3:
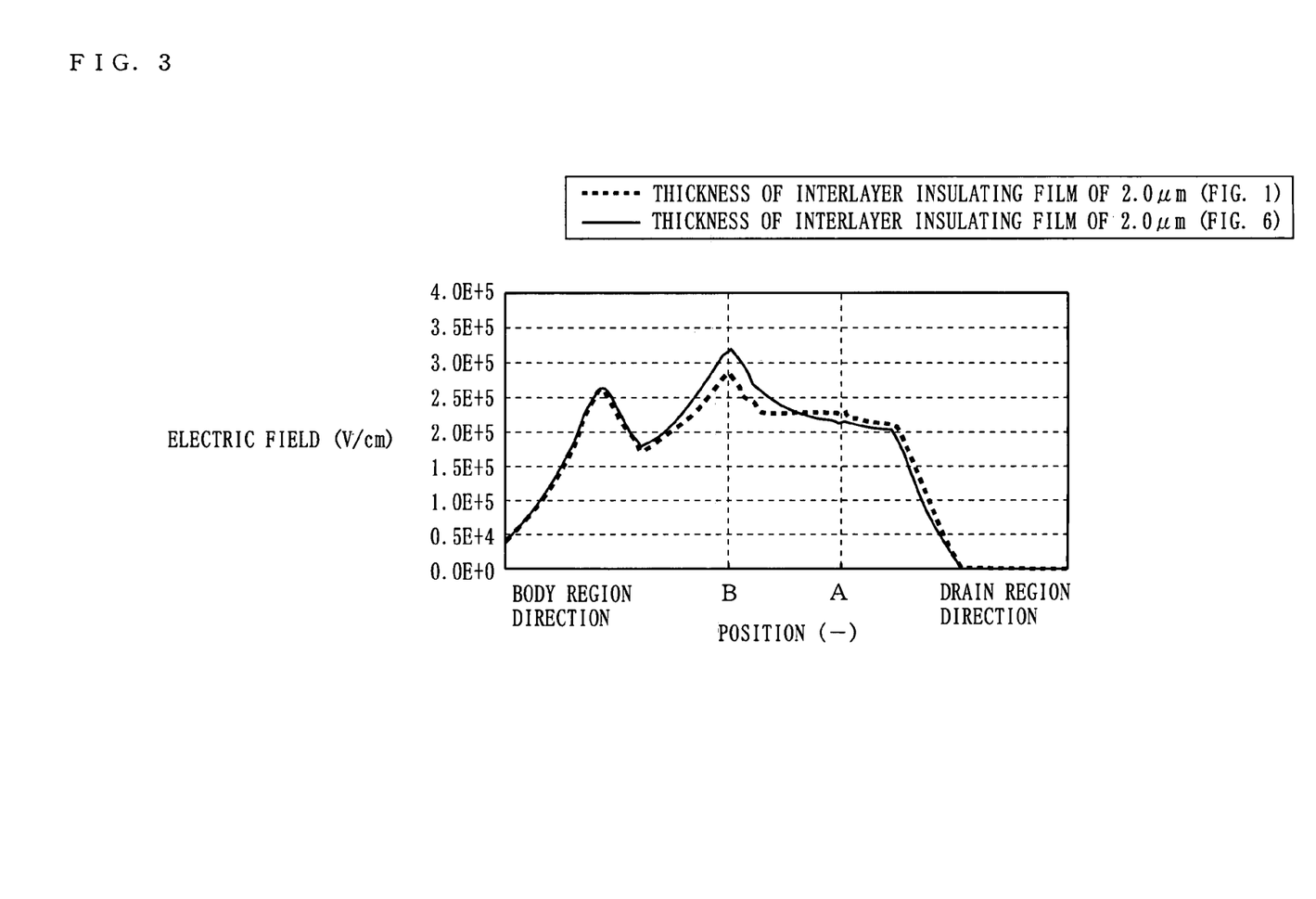
FIG. 3 is a graph showing analysis results for the electric field distributions of the high breakdown voltage lateral MOSFET according to the embodiment of the present invention and a conventional high breakdown voltage lateral MOSFET.

Using the high breakdown voltage lateral MOSFET according to the present embodiment which is configured in the above-described manner and the conventional high breakdown voltage lateral MOSFET shown in FIG. 6, the electric field distributions for the case where the thickness of the interlayer insulating films 110a, 110b, and 110c is 2.0 μm, are analyzed with a two-dimensional simulation. The obtained analysis results are shown in FIG. 3. In FIG. 3, the vertical axis represents electric field (V/cm), and the horizontal axis represents the measured position of the electric field. A and B on the horizontal axis represent the points A and B of FIGS. 1 and 6, respectively. In FIG. 3, a broken line shows the electric distribution of the high breakdown voltage lateral MOSFET shown in FIG. 1, and a solid line shows the electric field distribution of the high breakdown voltage lateral MOSFET shown in FIG. 6.

As is clear from the analysis results shown in FIG. 3, in the high breakdown voltage lateral MOSFET according to the present embodiment, the effect of reducing the electric field present below an end of the field plate portion 109a of the gate electrode 109, i.e., at the point B, is better than that obtained by the conventional structure.

Further, using the high breakdown voltage later a MOSFET according to the present embodiment which is configured in the above-described manner and the conventional high breakdown voltage lateral MOSFETs shown in FIGS. 5 and 6, the PN-junction breakdown voltage capability is examined for the case where the thickness of the interlayer insulating films 110a, 110b, and 110c is changed from 0.5 μm to 2.0 μm. Note that as the conventional case, the high breakdown voltage lateral MOSFET shown in FIG. 5 is used where the thickness of the interlayer insulating films 110a, 110b, and 110c is from 0.5 μm to 1.5 μm, and the high breakdown voltage lateral MOSFET shown in FIG. 6 is used where the thickness of the interlayer insulating films 110a, 110b, and 110c is 2.0 μm. The obtained measurement results are shown in FIG. 4.

Figure 4:
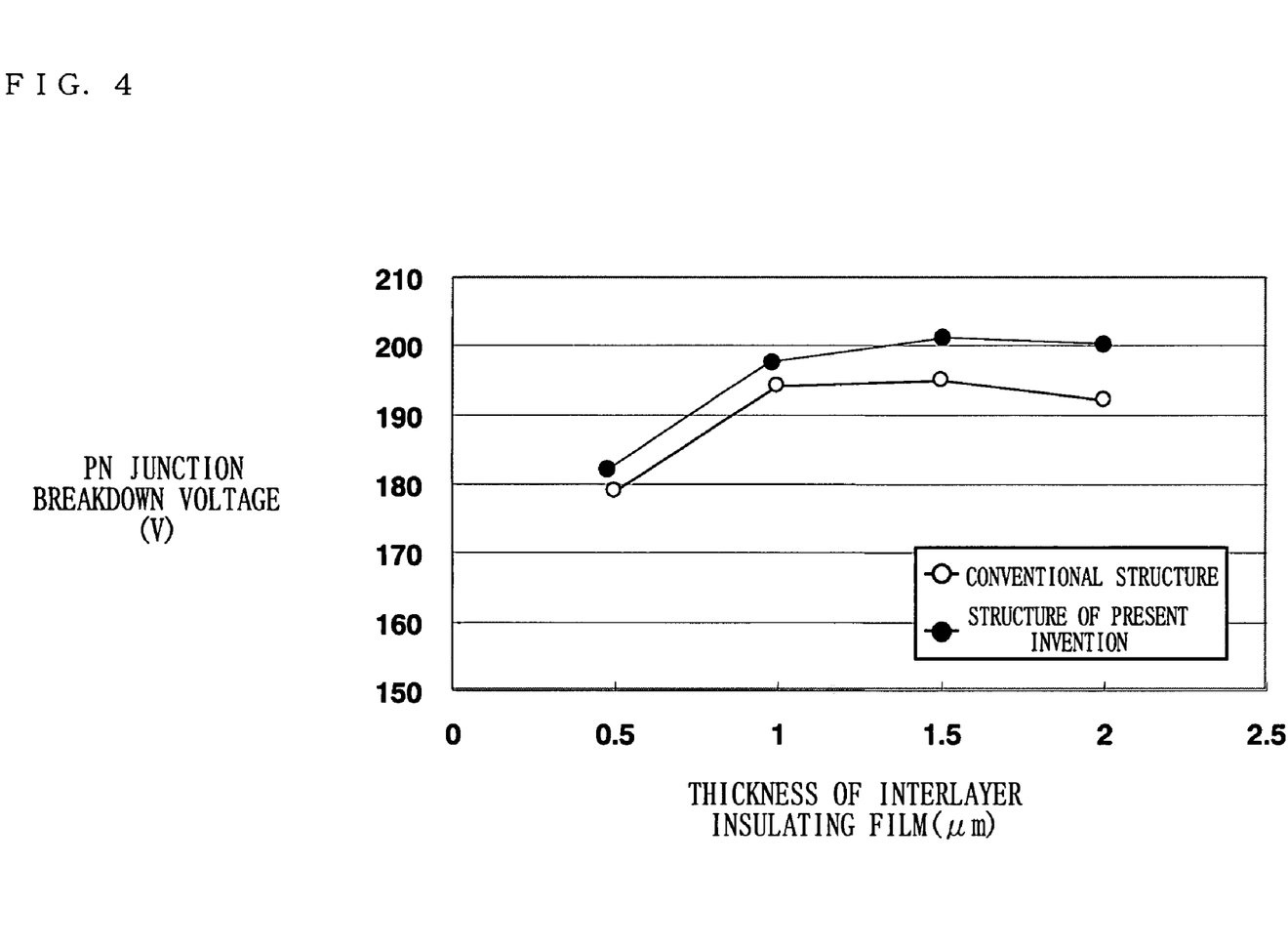
FIG. 4 is a graph showing a relationship between the PN-junction breakdown voltage capability and an interlayer insulating film for the high breakdown voltage lateral MOSFET according to the embodiment of the present invention and the conventional high breakdown voltage lateral MOSFET.

In FIG. 4, the vertical axis of the graph represents the PN-junction breakdown voltage (V), and the horizontal axis represents the thickness (μm) of the interlayer insulating films 110a, 110b, and 110c. In FIG. 4, the black circles represent the PN-junction breakdown voltages for the high breakdown voltage lateral MOSFET of the present embodiment shown in FIG. 1, and the white circles represent the PN-junction breakdown voltages for the high breakdown voltage lateral MOSFETs shown in FIGS. 5 and 6. It is clear from the measurement results shown in FIG. 4 that in the high breakdown voltage lateral MOSFET according to the present embodiment the effect of improving the PN-junction breakdown voltage capability is better than that obtained by the conventional structures. It can be seen that such a tendency is remarkable particularly when the thickness of the interlayer insulating films 110a, 110b, and 110c is large.

Although the above description is provided using an example case where as the insulating film formed between a gate electrode 109 and a source electrode 111, a filling insulating film 114a serving as a first insulating film and an interlayer insulating film 110a serving as a second insulating film are used, the present invention is not limited thereto; the insulating film may have a single-layer structure or a stacked-layer structure composed of three or more layers, as long as the thickness of the insulating film present on an end-portion region T of a field plate portion 109a is smaller than the thickness of the insulating film present below an end of a field plate portion 111a above the drain region 104 and smaller than the thickness of the insulating film on an end portion of the gate electrode 109 present above the body region 105. In addition, although in the above description a LOCOS oxide film 107 is not included as an insulating film, by increasing the thickness of the LOCOS oxide film 107 the PN-junction breakdown voltage capability can be further improved, as in the case of the aforementioned conventional examples.

Although the above description is provided using an example case where a semiconductor device has an isolation trench 113 formed therein, the present invention can also be applied to a semiconductor device having no isolation trench 113 formed therein. Note, however, that in the case of a semiconductor device having formed therein an isolation trench 113, by using a filling insulating film to fill the isolation trench 113 as a first insulating film, an insulating film having a desired thickness can be easily formed without increasing the number of processes, and thus such a configuration is desirable.

Moreover, although the above-described description is provided for the case of an N-channel lateral MOSFET, the present invention is not limited thereto and can also be applied to a P-channel lateral MOSFET, and further to a semiconductor device in which a high breakdown voltage element, such as a lateral diode or a lateral IGBT (Insulated Gate Bipolar Transistor), and a TC circuit are combined.

The semiconductor device and method of fabricating the semiconductor device according to the present invention can be advantageously applied to a semiconductor device in which an IC circuit and a high breakdown voltage element are combined, and the like.

While the invention has been described in detail, the foregoing description is in all aspects illustrative and not restrictive. It is understood that numerous other modifications and variations can be devised without departing from the scope of the invention.

What is claimed is:

1. A semiconductor device comprising:
an SOI layer formed on a supporting substrate with a buried oxide film placed therebetween;
a body region of a first conductive type selectively formed in a main surface of the SOI layer;
a source region of a second conductive type formed in a main surface of the body region;
a drain region of the second conductive type formed in the main surface of the SOI layer so as to be adjacent to the body region;
an element isolating film formed on the drain region;
a gate oxide film formed on a region of the main surface of the SOI layer between the source region and the element isolating film;
a drain electrode connected to the drain region;
a gate electrode which is formed on the gate oxide film and a part of the element isolating film and is extended in a drain region direction so as to have a first end over the part of the element isolating film;
an insulating film covering the gate electrode and the element isolating film; and
a source electrode which is formed on the insulating film so as to be connected to the source region and is extended in the drain region direction further than the first end of the gate electrode so as to have an end portion above the drain region, wherein
a first thickness of the insulating film at a position over the first end of the gate electrode is smaller than a second thickness of the insulating film at a position below the end portion of the source electrode above the drain region
the first thickness is smaller than a third thickness of the insulating film at a position on a second end of the gate electrode above the body region, and
the first thickness is equal to a fourth thickness of the insulating film at a position over the part of the element isolating film between the first end of the gate electrode and the end portion of the source electrode above the drain region.

2. A semiconductor device comprising:
an SOI layer formed on a supporting substrate with a buried oxide film placed therebetween;
a body region of a first conductive type selectively formed in a main surface of the SOI layer;
a source region of a second conductive type formed in a main surface of the body region;
a drain region of the second conductive type formed in the main surface of the SOI layer so as to be adjacent to the body region;
an element isolating film formed on the drain region;
a gate oxide film formed on a region of the main surface of the SOI layer between the source region and the element isolating film;
a drain electrode connected to the drain region;
a gate electrode which is formed on the gate oxide film and a part of the element isolating film and is extended in a drain region direction so as to have a first end over the part of the element isolating film;
an insulating film covering the gate electrode and the element isolating film; and
a source electrode which is formed on the insulating film so as to be connected to the source region and is extended in the drain region direction further than the first end of the gate electrode so as to have an end portion above the drain region, wherein
a first thickness of the insulating film at a position on the first end of the gate electrode is smaller than a second thickness of the insulating film at a position below the end portion of the source electrode above the drain region,
the first thickness is smaller than a third thickness of the insulating film at a position on a second end of the gate electrode above the body region,
the insulating film is composed of a first insulating film formed on the gate electrode and the element isolating film, and a second insulating film covering the first insulating film, and
an end portion of the first insulating film formed on the gate electrode, which is present above the drain region, is located so as not to overlap with the first end of the gate electrode above the drain region, as viewed from the main surface of the supporting substrate.

3. The semiconductor device according to claim 2, wherein a spacing distance is at least twice as large as a thickness of the second insulating film, the spacing distance being between the first end of the gate electrode above the drain region and an end portion of the first insulating film formed on the element isolating film, which faces first the end of the gate electrode, as viewed from the main surface of the supporting substrate.

4. The semiconductor device according to claim 2, wherein the SOI layer further includes an isolation trench which reaches the buried oxide film, and the isolation trench has the first insulating film buried therein.

* * * * *